United States Patent [19]

Anderson, III et al.

[11] Patent Number: 4,644,310

[45] Date of Patent: Feb. 17, 1987

[54] ACTUATOR SYSTEM HAVING MAGNETOMECHANICAL CANTILEVER BEAM FORMED OF FERROMAGNETIC AMORPHOUS MATERIAL

[75] Inventors: Philip M. Anderson, III, Chatham; Jeffrey C. Urbanski, Sparta, both of N.J.

[73] Assignee: Allied Corporation, Morris Township, Morris County, N.J.

[21] Appl. No.: 592,199

[22] Filed: Mar. 22, 1984

[51] Int. Cl.$^4$ .............................................. H01F 7/06
[52] U.S. Cl. ..................................... 335/215; 148/403
[58] Field of Search ................. 335/215, 209; 148/403

[56] References Cited

U.S. PATENT DOCUMENTS 3,165,653  1/1965  Preisinger ........................ 335/215 X
3,488,587  1/1970  Sparrow ........................... 335/215 X
3,638,153  1/1972  Sparrow ............................. 335/215
3,653,069  3/1972  Baring ............................. 335/215 X
3,961,297  6/1976  Garshelis ............................ 335/215

Primary Examiner—George Harris
Attorney, Agent, or Firm—Ernest D. Buff; Gerhard H. Fuchs

[57] ABSTRACT

An actuator system comprises a magnetomechanical cantilever beam adapted to be responsive to magnetic fields of various magnitudes. The system provides precise and rapid repositioning of the free end of the beam corresponding to the magnitude of the applied magnetic field. The beam is comprised of magnetostrictive ferromagnetic amorphous material and provides efficient, high force, high speed actuation to devices requiring electronically controlled variable displacement motion.

11 Claims, 5 Drawing Figures

ACTUATOR SYSTEM HAVING MAGNETOMECHANICAL CANTILEVER BEAM FORMED OF FERROMAGNETIC AMORPHOUS MATERIAL

BACKGROUND OF THE INVENTION

1. Field of the Invention

This invention relates to actuator systems and magnetomechanical cantilever beams used therein, and more particularly to a magnetomechanical cantilever beam that enhances the versatility of the actuator system.

2. Description of the Prior Art

Actuators of the type upon which this invention has improved are conventionally employed as indirectly activated driving mechanisms providing repetitive displacements of desired force and magnitude. Two main classes of such actuator systems presently include mechanically activated cam follower systems and electronically activated solenoid plunger systems.

A cam is usually a plate or cylinder which communicates motion to a follower by means of its edge or a groove cut in its surface. In the practical design of cams the follower (1) must assume a definite series of positions while the driver occupies a corresponding series of positions or (2) must arrive at a definite location by the time the driver arrives at a particular position. The former design is severely limited in speed because the interrelationship between the follower and cam positions yields a follower displacement versus time function that involves large values for the successive time derivatives, indicating large accelerations and forces and large impacts and noise. The second design requires the determination of that particular interrelationship between the follower and cam positions which results in minimum forces and impacts, so that the speed may be increased. In the case of high speed machines, small irregularities in the cam surface or geometry may be severely detrimental. Thus cam and follower systems have two major drawbacks, they produce relatively slow motions and they have minimal versatility resulting from their need to be mechanically activated.

A solenoid and plunger system is a helically wound insulated conductor (solenoid) provided with a movable iron rod or bar (plunger). When the coil is energized, the iron rod becomes magnetized and the mutual action of the field in the solenoid on the poles of the plunger causes the plunger to move within the solenoid. This force becomes zero when the magnetic centers of the plunger and solenoid coincide. When a load is attached to the plunger, work will be done until the force to be overcome is equal to the force that the solenoid exerts on the plunger. The force usually increases very sharply near the final seating point of the plunger and care must be taken that sufficient excess force is available throughout the stroke to prevent stalling of the motion. The duty cycle of solenoids is often limited to the classifications of continuous and intermittent. The main limitation in duty cycles is the amount of resistive heating that can be tolerated by the solenoid without damage to itself or its surroundings during its operating cycle. Force availability drops off rapidly with rising coil temperature. The larger the required force, the larger the solenoid and plunger must become to decrease the resistive heating which, in turn, increases the system's time response. As a result, solenoid and plunger systems typically have a large size-to-force ratio and are relatively inefficient owing to their method of magnetic to mechanical energy transfer.

SUMMARY OF THE INVENTION

The present invention provides an efficient, high force, high speed actuator system for operating devices requiring an electronically controlled variable displacement motion. Generally stated the actuator system comprises a magnetomechanical cantilever beam adapted to be responsive to magnetic fields of various magnitudes. In this manner there is produced precise and rapid repositioning of the free end of the magnetomechanical cantilever beam. Such positioning of the free end of the beam corresponds to the magnitude of the applied magnetic field. The magnetomechanical cantilever beam is comprised of magnetostrictive ferromagnetic amorphous material having a magnetomechanical coupling factor, k, greater than zero, where $k=(1-fr^2/fa^2)^{\frac{1}{2}}$, fr and fa being the resonant and antiresonant frequencies, respectively.

Advantageously, a precise and rapid repositioning of the beam's free end is accurately produced by electronically varying the strength of the magnetic field applied to the magnetomechanical cantilever beam. Such a motion is highly desirable in actuator systems where displacement magnitudes and cycle frequencies are required to fluctuate. The magnetomechanical cantilever beam provides a mechanically coupled actuator system whose positioning can be electronically controlled by supplying magnetic fields of predetermined strengths. The magnetomechanical cantilever beam supplies a comparatively large force to size ratio along with the speed and accuracy of being electronically activated and mechanically coupled.

An actuator system such as this has highly desirable characteristics for employment in a diversified field of applications. The high speed of the magnetomechanical cantilever beam actuator is ideally suited for use in fuel injectors. The electronically controlled positioning and relatively large force generation combine to produce a precision cutting tool. The high speed and high force of the actuator can also be utilized in a high current switch. Such devices represent but a few of the many devices whose efficiency is increased by use of a magnetomechanical cantilever beam.

BRIEF DESCRIPTION OF THE DRAWINGS

The invention will be more fully understood and further applications will become apparent when reference is made to the following detailed description of the preferred embodiment of the invention and the accompanying drawings in which.

DESCRIPTION OF THE PREFERRED EMBODIMENTS

Figure 1:
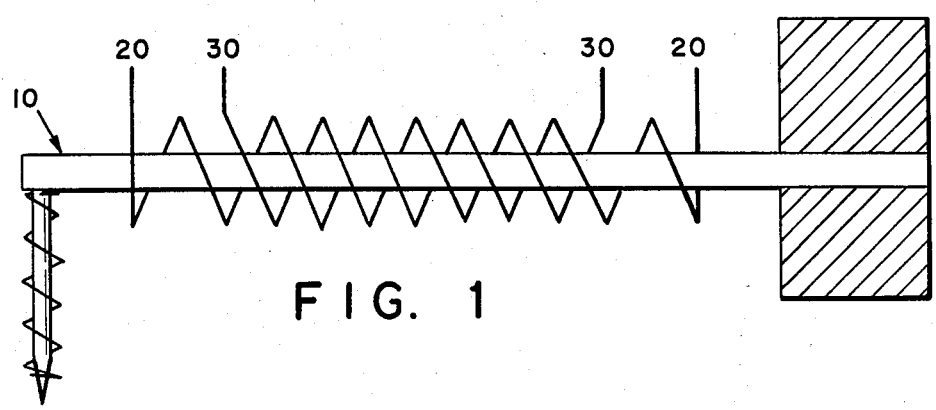
FIG. 1 is an isometric view of an actuator system in which a magnetomechanical cantilever beam is the driving mechanism.

The magnetomechanical cantilever composite beam of the actuator system may be fabricated in a number of diverse sizes and configurations. As a consequence the invention will be found to function in many varieties of actuator applications. For illustrative purposes the invention is described in connection with a composite beam consisting solely of amorphous magnetostrictive ferromagnetic material and structural adhesive. It will be readily appreciated that the invention can be altered for specific applications by incorporating additional materials within the composite beam or utilizing alternative methods and/or materials in the construction of magnetomechanical beams. Accordingly, the invention is intended to encompass all possible configurations of magnetomechanical beams for use in actuators.

The magnetomechanical cantilever beam may be constructed in various methods, including bonding segments of magnetostrictive ferromagnetic amorphous ribbon together with a film of structural adhesive or physically pressing (i.e. hot isostatic pressing) such ribbon into a beam or mechanically consolidating powdered magnetostrictive amorphous ferromagnetic material into a desired configuration. Beams such as these utilizing magnetostrictive amorphous ferromagnetic material experience large changes in Youngs modulus (delta E effect) upon exposure to a specific range of magnetic field strengths. The change in Young's modulus together with a constant force such as gravity produces a corresponding deflection change of the beams free end, thus providing a magnetic field dependent displacement change which operates as a high speed, high force mechanically coupled actuator.

More specifically the actuator consists of a magnetomechanical cantilever beam surrounded by a closely coupled drive coil. An electrical current in the drive coil provides a magnetic field, which provides for the precise positioning of the actuator. The magnetomechanical cantilever beam's Youngs modulus can be varied by applying magnetic fields of varying strengths. This magnetic field dependent Youngs modulus change, when applied to a magnetomechanical cantilever beam, which is predeflected by its own weight, or other external force, allows this deflection to change in the direction corresponding to the changes in modulus. The standard equation for cantilever beams, $E = (PL^3)/(3VI)$ where $P$ = the force on the free end of the beam, $L$ = the free length of the beam, $V$ = the deflection of the beam's free end, $I$ = the beams moment of inertia $(bh^3)/12$, shows the relationship between Youngs modulus $E$ and deflection $V$. Another important relationship from the above equation is that deflection $V$ increases with increasing force $P$ on the free end of the beam. Therefore, upon providing an unchanging $E$ the $V$ increases with increasing $P$. Thus, a preloaded magnetomechanical cantilever beam, when subjected to a change in magnetic field from the drive coil, produces a precise and rapid repositioning of the beam's free end. This mechanism is ideally suited for electronically controlled actuator systems, whose displacement magnitude can be electronically adjusted by offsetting the strength of the driving field.

Figure 2:
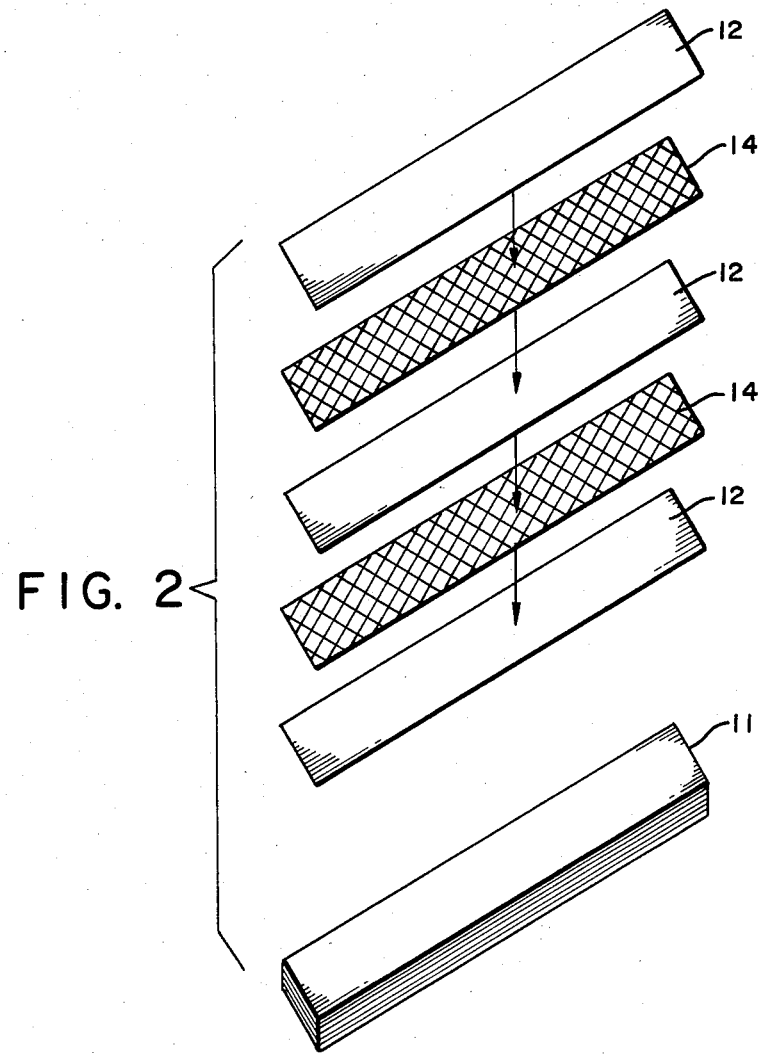
FIG. 2 is an assembly diagram of a magnetomechanical composite beam adapted for use in actuator system of FIG. 1.
Figure 3:
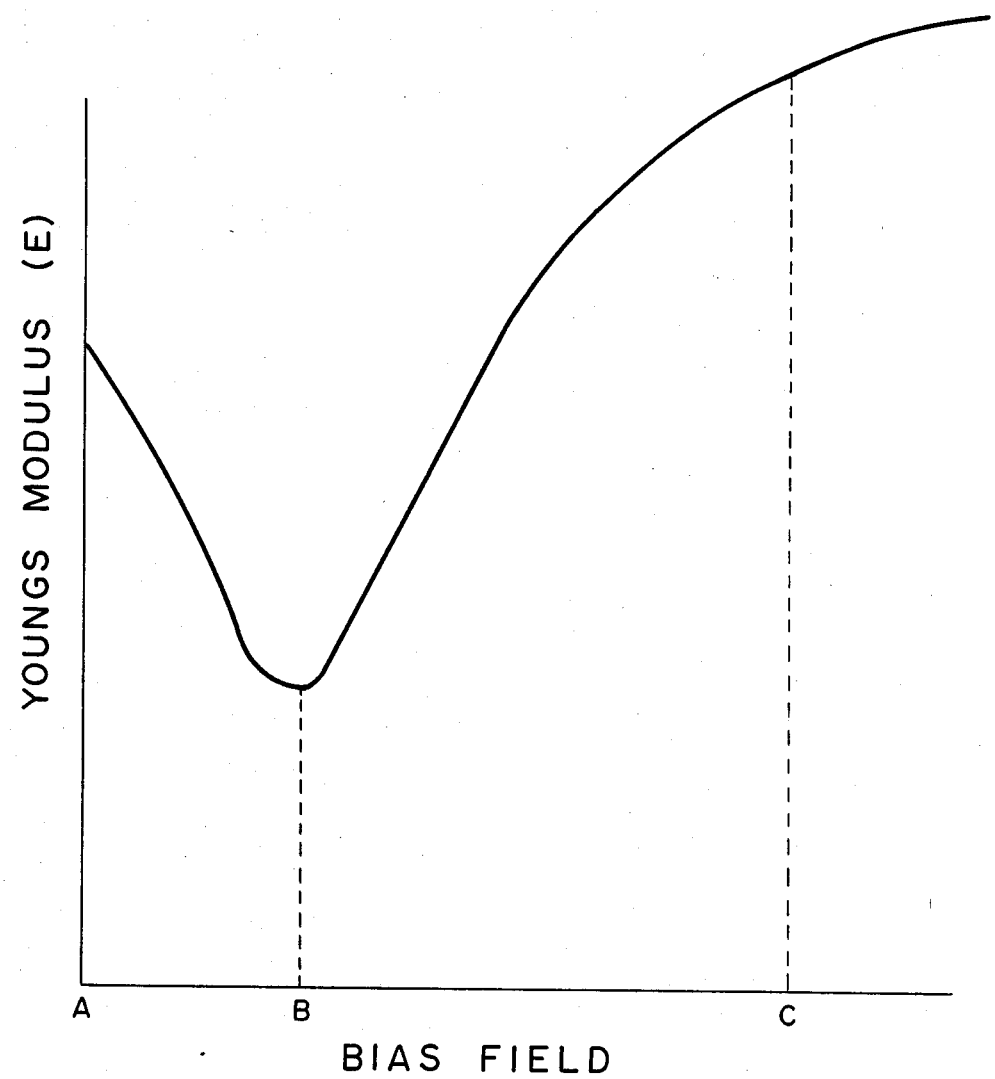
FIG. 3 is a graph showing the change in Young's modulus in a magnetomechanical beam over a preselected range of magnetic fields (H)
Figure 4:
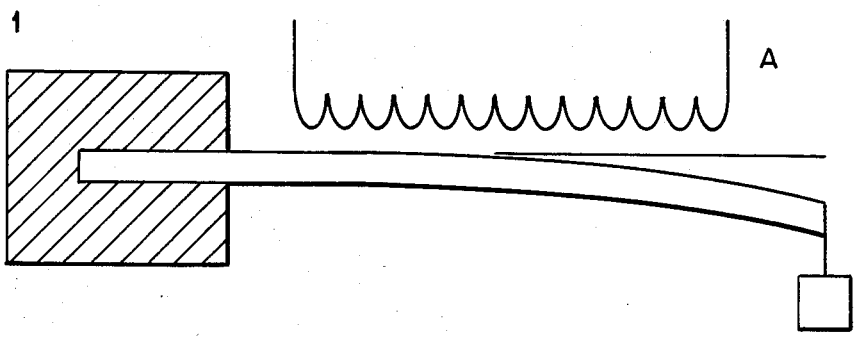
FIG. 4 is a sequence of drawings depicting the change in deflection of a magnetomechanical cantilever beam's free end corresponding to the relationship displayed by the graph in FIG. 3.
Figure 4:
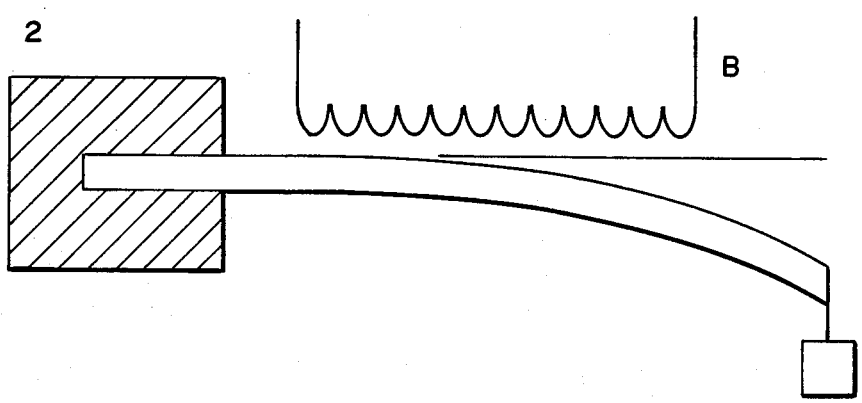
Figure 4:
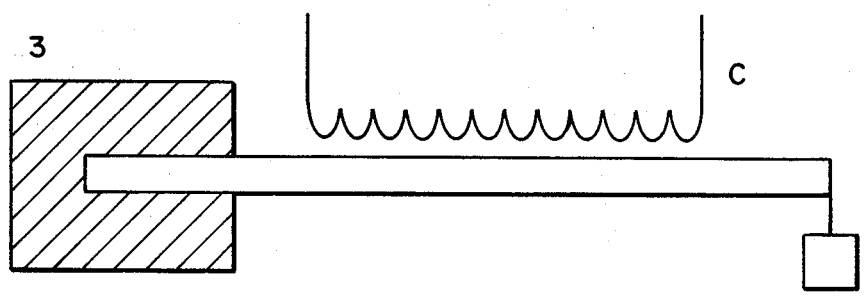

Referring to FIGS. 1 and 2 of the drawings, there is shown an actuator system incorporating a magnetomechanical cantilever composite beam 10 enclosed within two closely coupled co-axial coils 20 and 30. The composite beam 10 is composed of amorphous magnetostrictive ferromagnetic ribbon segments bonded by a structural adhesive (for example 3M type AF-147 structural adhesive with spacing mesh). The composite beam 10 must be constructed in such a manner that the structural adhesive content of the composite beam 10 is the minimum amount necessary to retain structural rigidity. The composite beam 10 is rigidly secured at one end while its opposite end is free to move forming a typical cantilever beam 10. The free end of the cantilever beam suffers the largest deflection when the beam is transversely loaded. Such transverse loading can be produced by attaching a spring 40 in tension or compression to the magnetomechanical cantilever beam's free end. This deflection produces tensile and compressive stresses in opposing surfaces of the beam. The amount of deflection can be related to the magnitude of these stresses and the physical qualities of the beam (i.e. Youngs modulus, thickness). Thus the effect of these stresses on the amount of deflection may be altered by changing one of the beams physical qualities, specifically Youngs modulus. The ability to change the Youngs modulus of most materials by means other than heating is quite difficult. However, the Youngs modulus of amorphous magnetostrictive ferromagnetic materials may be controllably altered by subjecting such materials to magnetic fields of various strengths (see FIG. 3). This phenomena is well known as the delta E effect. This means the amount of deflection or the position of the free end of the magnetomechanical cantilever composite beam can be controlled by altering the beams Youngs modulus via varying magnetic field strengths (see FIG. 4). This varying magnetic field is produced by the coaxial coils 20 and 30 as shown in the actuator system of FIG. 1. Coil 20 provides a steady uniform magnetic field for adjusting the magnetomechanical cantilever composite beam's initial deflection. The second coil 30 provides the varying magnetic field designed to rapidly adjust the position of the magnetomechanical cantilever composite beam's free end to any position within the beam's operating range. Note that while both coils 20 and 30 surround and are coupled to the beam 10 they are rigidly secured separately and do not contact the beam 10. By connecting the free end of the magnetomechanical cantilever composite beam 10 to a device requiring rapid repositioning (ie. blade, valve, electrical contact) an extremely versatile actuator system is developed wherein the device may be electronically positioned by varying the strength of the magnetic field applied to the beam 10. The connection between beam 10 and the device (not shown) can be made with mechanical fasteners such as clamps, bolts or the like.

Thus, there is shown in FIG. 1 of the drawings a magnetomechanical actuator system 1 responsive to magnetic fields of various magnitudes applied to a magnetomechanical cantilever beam 10. As shown in FIG. 1, beam 10 has a fixed end 40 and a free end 42. System 1 has means for generating a magnetic field, which may comprise a generator or other current source adapted to provide rapidly variable coil currents. In addition, system 1 has means (coil 30) for applying a magnetic field to cantilever beam 10 to cause free end 42 to move between a first set of positions. A second current source such as a generator, battery or the like provides system 1 with means for generating an adjusting magnetic field. Coil 20 provides system 1 with means for applying the adjusting magnetic field to cantilever beam 10 to cause free end 42 to move between a second set of positions. Means are provided for securing a device 44 to free end 42 of beam 10 and for securing fixed end 40 of beam 10 to a rigid object 46.

Figure 5:
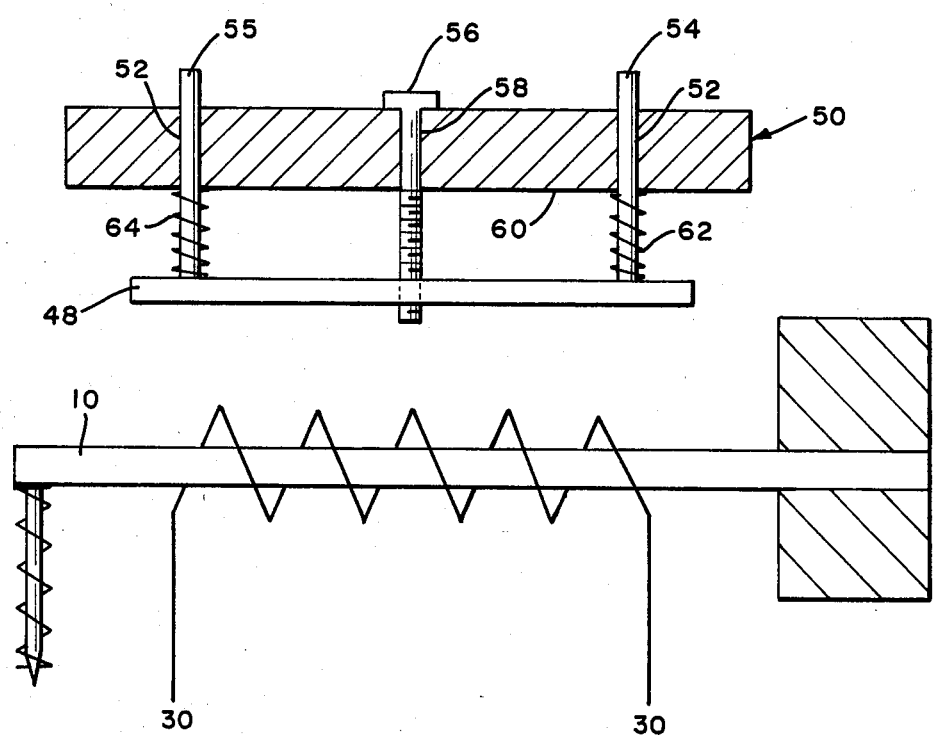
FIG. 5 is an isometric view of an actuator system in which a magnetomechanical cantilever beam is biased by a permanent magnet.

The magnetomechanical actuator system described herein can, of course, be modified in numerous ways without departing from the scope of the invention. For example, as shown in FIG. 5, the means for generating the adjusting magnetic field and applying it to beam 10 can comprise a permanent magnet 48 disposed coaxially of beam 10 for providing a uniform magnetic field over substantially the entire length thereof. Permanent magnet 48 is mounted on a support 50 capable of providing movement of magnet 48 relative to the beam 10. In the embodiment in FIG. 5, a support 50 is provided with channels 52 through which guides 54, 55 are adapted to move. Guides 54, 55 are rigidly connected to magnet 48. Magnet 48 is threaded to receive adjusting screw 56, which, in turn, rotates within channel 58 of support 50. The distance between side 60 of support 50 and magnet 48 is adjusted by turning screw 56. The support 50 has side 60 arranged substantially parallel to beam 10. Springs 62, 64 connected to guides 54, 55 maintain magnet 48 substantially parallel to beam 10 during movement of the magnet 48 relative thereto. In this manner, the permanent magnet 48 is adapted to provide an adjustable strength magnetic field upon the magnetomechanical cantilever beam 10. Other similar modifications can be made which fall within the scope of the present invention. It is, accordingly, intended that all matter contained in the above description and shown in the accompanying drawings be interpreted as illustrative and not in a limiting sense.

In accordance with the preferred embodiment of the invention, the composite beam 10 is composed of a magnetostrictive amorphous metal alloy and a structural adhesive. The magnetostrictive amorphous metal alloy is in the form of uniform lengths of ductile ribbon 12 having a first component composed of a composition consisting essentially of the formula $M_a N_b O_c X_d Y_e Z_f$, where M is at least one of iron and cobalt, N is nickel, O is at least one of chromium and molybdenum, X is at least one of boron and phosphorus, Y is silicon, Z is carbon, "a"–"f" are in atom percent, "a" ranges from about 35–85, "b" ranges from about 0–45, "c" ranges from about 0–15 and "f" ranges from about 0–2, and the sum of d+e+f ranges from about 15–25. The structural adhesive should make up a minimum amount of the composite beam's composition necessary to retain the composite beam's structural rigidity. An example of such an adhesive is type AF-147 structural adhesive with spacing mesh manufactured by the 3M company. This adhesive comes in a flexible thin film form capable of being cut into matching strips 14 and inserted between lengths of magnetostrictive ribbon as shown in FIG. 2. The finished composite beam 10 is formed by heating and compressing the alternate layers of ribbon 12 and adhesive 14 with 206 kPa at 145° C. for 90 minutes. The spacing mesh is important as it prevents the structural adhesive from being completely compressed from in between layers of ribbon thus retaining a uniform bond.

It is well known that when tension is applied to an unmagnetized ferromagnetic material, its length increases as a result of (1) a purely elastic expansion of the kind that occurs generally in solids and (2) an expansion resulting from the orientation of domains under stress. The increase in length of the second kind results from the magnetostriction associated with domain orientation, and is responsible for the fact that in ferromagnetic materials Young's modulus, E, depends on amplitude of strain and on intensity of magnetization. The change of Young's modulus with magnetization is often called the delta E effect.

It has been found that amorphous magnetostrictive metallic alloy ribbon having the formula specified above is particularly adapted to experience large changes in Young's modulus (giant delta E) at predetermined strengths of incident magnetic fields. While we do not wish to be bound by any theory, it is believed that, in ribbon of the aforesaid composition direct magnetic coupling between a magnetic field and the ribbon occurs by means of the following mechanism.

When a ferromagnetic material such as amorphous metallic ribbon is in a magnetic field (H) the ribbons magnetic domains are caused to grow and/or rotate. This domain movement allows magnetic energy to be stored, in addition to a small amount of energy which is lost as heat. When the field is removed the domains return to their original orientation releasing the stored magnetic energy, again minus a small amount of energy lost as heat. Amorphous metals have high efficiency in this mode of energy storage, because they have no grain boundaries and have high resistivities.

When the ferromagnetic ribbon is magnetostrictive, an additional mode of energy storage is also possible. In the presence of a magnetic field, a magnetostrictive amorphous metal ribbon will have energy stored magnetically as described above but will also have energy stored mechanically via magnetostrictive. This mechanical energy per unit volume stored can be quantified as $U_e = (\frac{1}{2})TS$ where T and S are the stress and strain on the ribbon. This additional mode of energy storage may be viewed as an increase in the effective magnetic permeability of the ribbon.

Transfer of magnetic and mechanical energy is called magnetomechanical coupling (MMC), and can be seen in all magnetostrictive materials. The efficiency of this energy transfer is proportional to the square of the magnetomechanical coupling factor (k), and is defined as the ratio of mechanical to magnetic energy. Phenomenologically, k is defined as $k = (1 - fr^2/fa^2)^{\frac{1}{2}}$ where fr and fa are the ribbons resonant and antiresonant frequencies. A large k insures a large delta E effect.

Changes in Young's modulus are influenced in a given amorphous metal by the level of bias field present, the level of internal stress (or structural anisotropy) present and by the level and direction of any magnetic anisotropy. Annealing an amorphous metal relieves internal stresses, thus permitting an enhanced delta E effect. The structural anisotropy is small due to the ribbon's amorphous nature, also enhancing the delta E effect. Annealing in a properly oriented magnetic field can significantly enhance the change in Young's modulus. Because of demagnetizing effects, it is practical to apply magnetic field to the composite beam only along its length (this being the longest dimension). Therefore, the induced magnetic anisotropy should be transverse to the long dimension of the ribbon composite beam.

Maximum values of the delta E effect are obtained by annealing the ribbon in a saturating magnetic field which is perpendicular to the ribbon length (cross-field annealed). For a ½ inch wide ribbon, a field of a few hundred oersteds is required. The optimum time and temperature of the anneal depends on the alloy employed. As an example, an iron-boron-silicon alloy yields an optimum coupling (k=0.90) and an optimum delta E effect of 350% when cross field annealed at 400° C. for 30 minutes. This anneal yields an optimum delta E effect with an applied bias field centered around 1 oersted. For alloys having compositions specified herein above, the annealing temperature ranges from about 300° to 450° C. and the annealing time ranges from about 7 to 120 minutes.

The anneal also affects bias field required to optimize delta E effect. For a given amorphous metal with a given anneal, the change in Young's modulus depends strongly on the applied bias field. At zero and saturating fields, the delta E effect is zero. For a given alloy, an optimum bias field exists which yields a maximum delta E effect. For alloys having the compositions specified herein, the bias field required to optimize delta E effect ranges from about 0.1 to 20 Oe.

Even though most magnetostrictive materials will exhibit some MMC, amorphous metals yield extremely high coupling factors, and are, therefore highly preferred. As-cast amorphous metals yield a larger delta E effect than most other magnetostrictive materials. No material has a larger delta E effect than amorphous metals when cross-field annealed. Amorphous metals have a large delta E effect because they have: (a) low magnetic losses (no grain boundaries, high resistivity), (b) low structural stress anisotropy, (c) reasonable magnetostrictive and (d) an ability to be given a beneficial magnetic anisotropy. Because the effect is so large in amorphous alloys it is commonly referred to as the giant delta E effect.

Amorphous metal alloys provide magnetomechanical beams with desired actuator characteristics because (a) they have a large delta E effect even when as-cast, (b) they are mechanically strong, tough and ductile in bending, (c) they require low bias fields and (d) they have extremely high magnetostrictivity. It will readily be appreciated, therefore, that the amorphous metals of which the composite beam of this invention is composed need not be annealed, but may be incorporated into the composite beam "as-cast".

Examples of amorphous ferromagnetic beam compositions in atomic percentages within the scope of this invention are set forth below in Table 1.

TABLE 1

| ALLOY | AS-CAST k | OPTIMAL ANNEALED k | OPTIMAL DELTA ANNEALED E |
|---|---|---|---|
| $Fe_{78}Si_9B_{13}$ | 0.35 | 0.90 | 350% |
| $Fe_{79}Si_5B_{16}$ | 0.31 | 0.90 | 340% |
| $Fe_{81}B_{12.5}Si_{3.5}C_2$ | 0.22 | 0.90 | 300% |
| $Fe_{67}Co_{18}B_{14}Si_1$ | 0.45 | 0.72 | 120% |
| $Fe_{40}Ni_{38}Mo_4B_{18}$ | 0.23 | 0.50 | 100% |

Common crystalline materials, such as annealed Ni have k's of 0.38 and delta E's of 30%. More exotic crystalline materials, such as annealed Tb Dy Fe alloys, have k's as high as 0.55 and delta E's of 150%. This last material is expensive, brittle and requires magnetic fields in excess of 4000 Oe. The amorphous alloys listed above all require bias fields of 12 Oe or less. Most amorphous alloys require less than 1 Oe.

The amorphous ferromagnetic metal in the composite beam of the invention is prepared by cooling a melt of the desired composition at a rate of at least about $10^5$ C/sec, employing metal alloy quenching techniques well-known to the amorphous metal alloy art; see, e.g., U.S. Pat. No. 3,856,513 to Chen, et al. The purity of all compositions is that found in normal commercial practice.

A variety of techniques are available for fabricating continuous ribbon, wire, sheet, etc. Typically, a particular composition is selected, powders or granules of the requisite elements in the desired portions are melted and homogenized, and the molten alloy is rapidly quenched on a chill surface, such as a rapidly rotating cylinder.

Under these quenching conditions, a metastable, homogeneous, ductile material is obtained. The metastable material may be amorphous, in which case there is no long-range order. X-ray diffraction patterns of amorphous alloys must be at least 50% amorphous to be sufficiently ductile to permit handling, such as beam construction without degradation of the finished beams properties. Preferably, the amorphous metal in the composite beam must be at least 80% amorphous to attain superior ductility.

The metastable phase may also be a solid solution of the constituent elements. In the case of the magnetomechanical beam of the invention, such metastable, solid solution phases are not ordinarily produced under conventional processing techniques employed in the art of fabricating crystalline alloys. X-ray diffraction patterns of the solid solution alloys show the sharp diffraction peaks characteristic of crystalline alloys, with some broadening of the peaks due to desired fine grain size of crystallites. Such metastable materials are also ductile in bending when produced under the conditions described above.

The amorphous ferromagnetic material in the magnetomechanical composite beam is exceedingly ductile in bending. By ductile in bending is meant that the ribbon can be bent around a radius as small as ten times its thickness without fracture. Such bending of the ribbon produces little or no degradation of the magnetomechanical properties of the finished composite beam. As a result the magnetomechanical composite beam retains its sensitivity despite the ribbon being flexed or bent during (1) manufacture (cutting or stamping the ribbon into desired length) (2) beam construction (3) beam operation.

Having thus described the invention in rather full detail, it will be understood that such detail need not be strictly adhered to but that various changes and modifications may suggest themselves to one skilled in the art, all falling within the scope of the invention.

What we claim is:

1. For use in a magnetomechanical actuator system, a magnetomechanical cantilever beam adapted to be responsive to magnetic fields of varying magnitudes to produce precise and rapid repositioning of the free end of the magnetomechanical cantilever beam corresponding to the magnitude of the applied magnetic field, said magnetomechanical beam comprising magnetostrictive ferromagnetic amorphous material having a magnetomechanical coupling factor, k, greater than zero where $k = (1 - f_r^2/f_a^2)^{\frac{1}{2}}$, $f_r$ and $f_a$ being the resonant and antiresonant frequencies respectively.

2. A magnetomechanical cantilever beam as recited in claim 1, wherein said magnetostrictive ferromagnetic material is at least 50 percent amorphous.

3. A magnetomechanical cantilever beam as recited in claim 1, wherein said magnetostrictive ferromagnetic material is at least 80 percent amorphous.

4. A magnetomechanical cantilever beam as recited in claim 1, wherein said magnetostrictive ferromagnetic amorphous material comprises a plurality of ribbon segments and said segments are bonded together with a film of structural adhesive to form said beam.

5. A magnetomechanical cantilever beam as recited in claim 4, said structural adhesive is a non-metallic type having spacing mesh.

6. A magnetomechanical cantilever beam as recited in claim 1, wherein said magnetostrictive ferromagnetic amorphous material comprises a plurality of ribbon segments directly pressed together to form said beam.

7. A magnetomechanical cantilever beam as recited in claim 1, wherein said magnetostrictive ferromagnetic amorphous material comprises a powder mechanically consolidated to form said beam.

8. A magnetomechanical cantilever beam as recited in claim 1, where the apparent Young's modulus of said magnetomechanical cantilever beam is dependent on the magnetic field applied thereto.

9. A magnetomechanical cantilever beam as recited in claim 1, wherein said magnetomechanical cantilever beam's free end position is dependent upon the applied load (P) and the Young's modulus (E) of said magnetomechanical cantilever beam.

10. A magnetomechanical cantilever beam as recited in claim 1, wherein said magnetomechanical cantilever beam's free end position is dependent upon the magnitude of the magnetic field applied thereto.

11. A magnetomechanical cantilever beam as recited in claim 2, wherein said magnetostrictive ferromagnetic amorphous material has a composition consisting essentially of the formula $M_a N_b O_c X_d Y_e Z_f$ wherein M is at least one of chromium and molybdenum, N is nickel, O is at least one of chromium and molybdenum, X is at least one of boron and phosphorous, Y is silicon, Z is carbon, "a"–"f" are in atom percentages, "a" ranges from about 35-85, "b" ranges from about 0-45, "c" ranges from about 0-15 and "f" ranges from abut 0-2, and the sum of d+e+f ranges from about 15-25.

* * * * *